(12) United States Patent
Steinlage et al.

(10) Patent No.: US 8,699,667 B2
(45) Date of Patent: Apr. 15, 2014

(54) APPARATUS FOR X-RAY GENERATION AND METHOD OF MAKING SAME

(75) Inventors: Gregory Alan Steinlage, Hartland, WI (US); Marshall Gordon Jones, Scotia, NY (US); Donald Robert Allen, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 333 days.

(21) Appl. No.: 12/640,323

(22) Filed: Dec. 17, 2009

(65) Prior Publication Data

US 2010/0092699 A1 Apr. 15, 2010

Related U.S. Application Data

(63) Continuation-in-part of application No. 11/865,928, filed on Oct. 2, 2007, now Pat. No. 7,720,200.

(51) Int. Cl.
| | |
|---|---|
| *H01J 35/08* | (2006.01) |
| *H01J 35/10* | (2006.01) |
| *G21G 4/00* | (2006.01) |
| *H05G 1/02* | (2006.01) |

(52) U.S. Cl.
USPC ............................ 378/143; 378/119; 378/210

(58) Field of Classification Search
USPC .................. 378/119, 143, 144, 210
See application file for complete search history.

(56) References Cited

U.S. PATENT DOCUMENTS

| | | | | |
|---|---|---|---|---|
| 2,690,403 | A * | 9/1954 | Gutzeit et al. ................. | 427/290 |
| 2,888,391 | A * | 5/1959 | Loughman .................... | 148/241 |
| 3,097,078 | A * | 7/1963 | Turner ............................ | 34/638 |
| 3,258,578 | A * | 6/1966 | Ferris ............................ | 392/404 |
| 3,730,962 | A * | 5/1973 | Norwalk ........................ | 373/11 |
| 3,993,923 | A | 11/1976 | Magendans et al. | |
| 4,090,103 | A | 5/1978 | Machenschalk et al. | |
| 4,098,005 | A * | 7/1978 | Wiarda ............... | 34/73 |
| 4,195,247 | A | 3/1980 | Hirsch | |
| 4,271,372 | A | 6/1981 | Geldner et al. | |
| 4,299,860 | A * | 11/1981 | Schaefer et al. .............. | 427/556 |
| 4,516,255 | A | 5/1985 | Petter et al. | |
| 4,547,227 | A * | 10/1985 | Herter .............................. | 134/7 |
| 4,613,386 | A | 9/1986 | Yates et al. | |
| 4,641,334 | A | 2/1987 | Devine, Jr. | |
| 5,204,891 | A | 4/1993 | Woodruff et al. | |
| 6,357,139 | B1 * | 3/2002 | Sassi ............................... | 34/210 |
| 6,487,275 | B1 | 11/2002 | Baba et al. | |
| 6,504,127 | B1 | 1/2003 | McGregor et al. | |
| 6,521,861 | B2 | 2/2003 | Jones et al. | |
| 7,194,066 | B2 * | 3/2007 | Tiearney et al. .............. | 378/143 |
| 7,286,893 | B1 | 10/2007 | Mazumder | |
| 7,505,565 | B2 | 3/2009 | Tiearney, Jr. et al. | |
| 2006/0049153 | A1 * | 3/2006 | Cahoon et al. ........... | 219/121.63 |

FOREIGN PATENT DOCUMENTS

| | | | | |
|---|---|---|---|---|
| DE | 3544240 | A1 * | 6/1987 | |
| JP | 47025108 | A * | 3/1971 | |
| JP | 03065272 | A * | 3/1991 | |
| SU | 1505976 | A1 * | 9/1989 | |
| WO | 2009019645 | A2 | 2/2009 | |

* cited by examiner

*Primary Examiner* — Anastasia Midkiff
(74) *Attorney, Agent, or Firm* — Ziolkowski Patent Solutions Group, SC

(57) ABSTRACT

A system for applying a target track material to an x-ray tube target includes a controller configured to direct a beam of energy toward an x-ray tube target, and direct a solid stock material toward the beam of energy to cause the solid stock material to melt and deposit as a melted material on the x-ray tube target.

20 Claims, 7 Drawing Sheets

APPARATUS FOR X-RAY GENERATION AND METHOD OF MAKING SAME

CROSS-REFERENCE TO RELATED APPLICATION

The present application is a continuation-in-part of and claims priority to U.S. patent application Ser. No. 11/865,928 filed Oct. 2, 2007, the disclosure of which is incorporated herein.

BACKGROUND OF THE INVENTION

Embodiments of the invention relate generally to x-ray tubes and, more particularly, to a system for applying a target track material and a method of fabrication.

X-ray systems typically include an x-ray tube, a detector, and a bearing assembly to support the x-ray tube and the detector. In operation, an imaging table, on which an object is positioned, is located between the x-ray tube and the detector. The x-ray tube typically emits radiation, such as x-rays, toward the object. The radiation typically passes through the object on the imaging table and impinges on the detector. As radiation passes through the object, internal structures of the object cause spatial variances in the radiation received at the detector. The detector then emits data received, and the system translates the radiation variances into an image, which may be used to evaluate the internal structure of the object. One skilled in the art will recognize that the object may include, but is not limited to, a patient in a medical imaging procedure and an inanimate object as in, for instance, a package in an x-ray scanner or computed tomography (CT) package scanner.

X-ray tubes include a rotating anode structure for the purpose of distributing the heat generated at a focal spot. The anode is typically rotated by an induction motor having a cylindrical rotor built into a cantilevered axle that supports a disc-shaped anode target and an iron stator structure with copper windings that surrounds an elongated neck of the x-ray tube. The rotor of the rotating anode assembly is driven by the stator. An x-ray tube cathode provides a focused electron beam that is accelerated across a cathode-to-anode vacuum gap and produces x-rays upon impact with the anode. Because of the high temperatures generated when the electron beam strikes the target, it is necessary to rotate the anode assembly at high rotational speed.

Newer generation x-ray tubes have increasing demands for providing higher peak power. Higher peak power, though, results in higher peak temperatures occurring in the target assembly, particularly at the target "track," or the point of impact on the target. Thus, for increased peak power applied, there are life and reliability issues with respect to the target. Such effects may be countered to an extent by, for instance, spinning the target faster. However, doing so has implications to reliability and performance of other components within the x-ray tube. As a result there is greater emphasis in finding material and fabrication solutions for improved performance and higher reliability of target structures within an x-ray tube. Furthermore, there is greater emphasis on repair and reuse of x-ray tube targets and other x-ray tube components. Thus there is a need to salvage what might otherwise be unrecoverable x-ray tube targets.

Known deposition processes include plasma spray and powder application sintering methods such as laser-enhanced near-net shape (LENS). However, though such processes may be used to successfully deposit materials of an x-ray tube target, such processes consume large volumes of expensive materials such as tungsten, molybdenum, and the like and can result in material waste. Further, such processes utilize a powder material which may limit available alloy options, and which typically precludes the use of tantalum and many Ta-alloys due to powder auto-inflammability.

Therefore, it would be desirable to have a method and apparatus to improve target track fabrication and repair of an x-ray tube target.

BRIEF DESCRIPTION OF THE INVENTION

Embodiments of the invention provide a method and apparatus that overcome the aforementioned drawbacks. The x-ray target track is fabricated or repaired using a laser beam or other heating mechanism to heat the substrate of the target while applying a material to the substrate in order to fuse the materials together. The process may be performed multiple times to form layered or graded structures or interfaces, and it may be performed to fabricate complex geometries of track or substrate material on the surfaces of the target.

According to one aspect of the invention, a system for applying a target track material to an x-ray tube target includes a controller configured to direct a beam of energy toward an x-ray tube target, and direct a solid stock material toward the beam of energy to cause the solid stock material to melt and deposit as a melted material on the x-ray tube target.

According to another aspect of the invention, a method of fabricating an x-ray tube target includes directing a spatially coherent electromagnetic beam toward a region of a target substrate, and feeding a solid stock material toward the region of the target substrate to melt the solid stock material and form a first layer on the target substrate.

According to yet another aspect of the invention, a method of repairing an x-ray tube target includes pointing a laser beam toward a region of an x-ray tube target to be repaired, such that the region is caused to melt and form a melt region, and regulating a solid feedstock toward the melt region.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
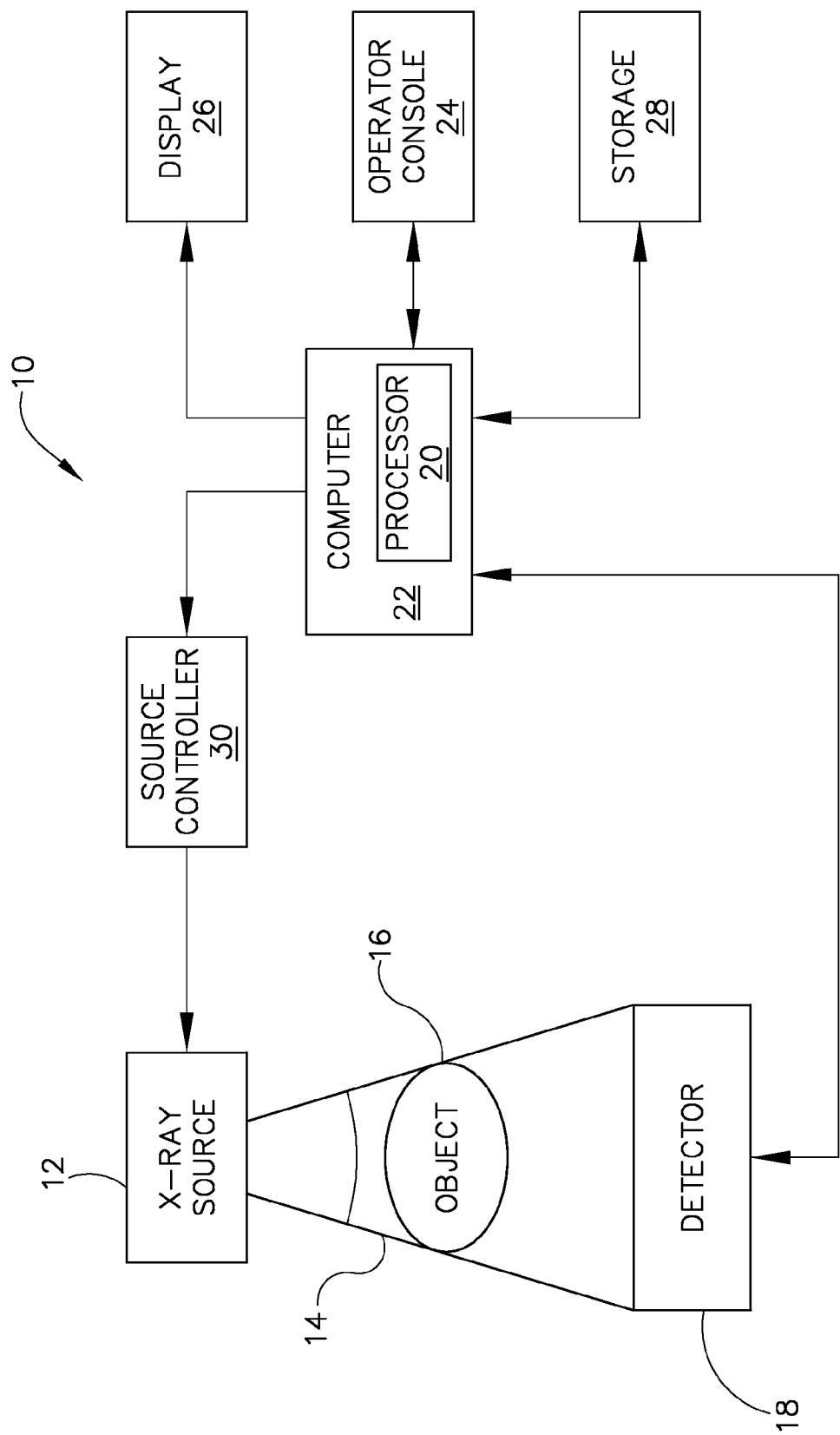
FIG. 1 is a block diagram of an imaging system that can benefit from incorporation of an embodiment of the present invention.

FIG. 1 is a block diagram of an embodiment of an imaging system 10 designed both to acquire original image data and to process the image data for display and/or analysis in accordance with the present invention. It will be appreciated by those skilled in the art that the present invention is applicable to numerous medical imaging systems implementing an x-ray tube, such as a CT system, an x-ray system, a vascular system, and a mammography system. Other imaging systems such as computed tomography systems and digital radiography systems also benefit from the present invention. The following discussion of x-ray system 10 is merely an example of one such implementation and is not intended to be limiting in terms of modality.

As shown in FIG. 1, x-ray system 10 includes an x-ray source 12 configured to project a beam of x-rays 14 through an object 16. Object 16 may include a human subject, pieces of baggage, or other objects desired to be scanned. X-ray source 12 may be a conventional x-ray tube producing x-rays having a spectrum of energies that range, typically, from 30 keV to 200 keV. The x-rays 14 pass through object 16 and, after being attenuated by the object, impinge upon a detector 18. Each detector in detector 18 produces an electrical signal that represents the intensity of an impinging x-ray beam, and hence the attenuated beam, as it passes through the object 16. In one embodiment, detector 18 is a scintillation based detector, however, it is also envisioned that direct-conversion type detectors (e.g., CZT detectors, etc.) may also be implemented.

A processor 20 receives the signals from the detector 18 and generates an image corresponding to the object 16 being scanned. A computer 22 communicates with processor 20 to enable an operator, using operator console 24, to control the scanning parameters and to view the generated image. That is, operator console 24 includes some form of operator interface, such as a keyboard, mouse, voice activated controller, or any other suitable input apparatus that allows an operator to control the x-ray system 10 and view the reconstructed image or other data from computer 22 on a display unit 26. Additionally, console 24 allows an operator to store the generated image in a storage device 28 which may include hard drives, floppy discs, compact discs, etc. The operator may also use console 24 to provide commands and instructions to computer 22 for controlling a source controller 30 that provides power and timing signals to x-ray source 12.

Moreover, the present invention will be described with respect to use in an x-ray tube. However, one skilled in the art will further appreciate that the present invention is equally applicable for other systems that require operation of a target used for the production of x-rays wherein high peak temperatures are driven by peak power requirements.

Figure 2:
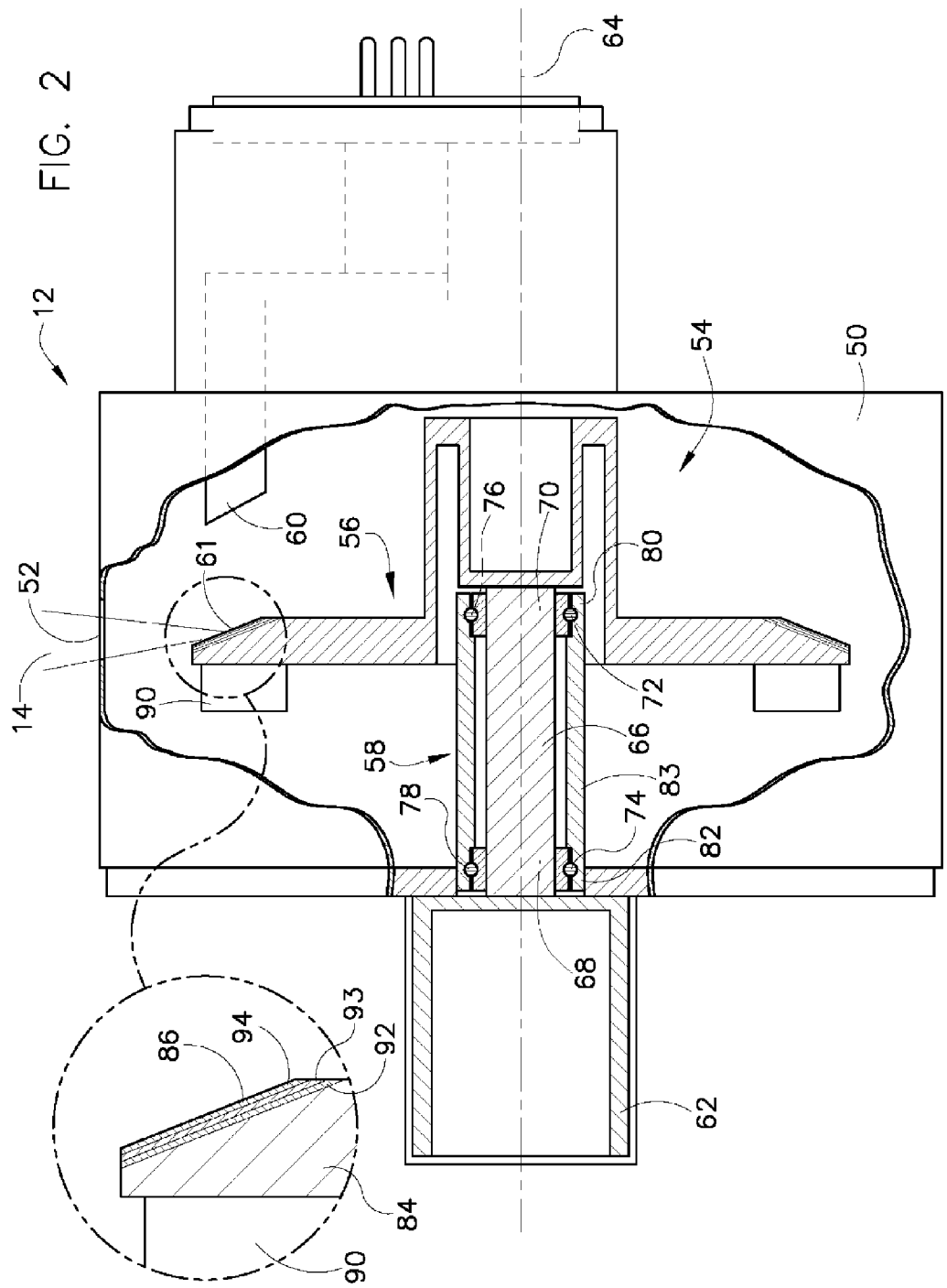
FIG. 2 is a cross-sectional view of an x-ray tube useable with the system illustrated in FIG. 1 according to an embodiment of the present invention.

FIG. 2 illustrates a cross-sectional view of an x-ray tube 12 that can benefit from incorporation of an embodiment of the present invention. The x-ray tube 12 includes a casing 50 having a radiation emission passage 52 formed therein. The casing 50 encloses a vacuum 54 and houses an anode 56, a bearing assembly 58, a cathode 60, and a rotor 62. X-rays 14 are produced when high-speed electrons are suddenly decelerated when directed from the cathode 60 to the anode 56 via a potential difference therebetween of, for example, 60 thousand volts or more in the case of CT applications. The electrons impact a material layer or target track 86 at focal point 61 and x-rays 14 emit therefrom. The point of impact is typically referred to in the industry as the focal spot, which forms a circular region or track on the surface of the target track 86, and is visually evident on the target surface after operation of the x-ray tube 12. According to an embodiment of the present invention, target track 86 may include a plurality of layers 92, 93, 94 applied according to the disclosed process. The x-rays 15 emit through the radiation emission passage 52 toward a detector array, such as detector 18 of FIG. 1. To avoid overheating the anode 56 from the electrons, the anode 56 is rotated at a high rate of speed about a centerline 64 at, for example, 90-250 Hz.

The bearing assembly 58 includes a center shaft 66 attached to the rotor 62 at first end 68 and attached to the anode 56 at second end 70. A front inner race 72 and a rear inner race 74 rollingly engage a plurality of front balls 76 and a plurality of rear balls 78, respectively. Bearing assembly 58 also includes a front outer race 80 and a rear outer race 82 configured to rollingly engage and position, respectively, the plurality of front balls 76 and the plurality of rear balls 78. Bearing assembly 58 includes a stem 83 which is supported by the x-ray tube 12. A stator (not shown) is positioned radially external to and drives the rotor 62, which rotationally drives anode 56. As shown in FIG. 2, a heat storage medium 90, such as graphite, may be used to sink and/or dissipate heat built-up near the target track 63.

Referring still to FIG. 2, the anode 56 includes a target substrate 84, having target track 86 attached thereto according to an embodiment of the present invention. The target track 86 typically includes tungsten or an alloy of tungsten such as tungsten with rhenium ranging from 3-10%. The target substrate 84 typically includes molybdenum or an alloy of molybdenum such as TZM (Titanium, Zirconium, and Molybdenum).

Figure 3:
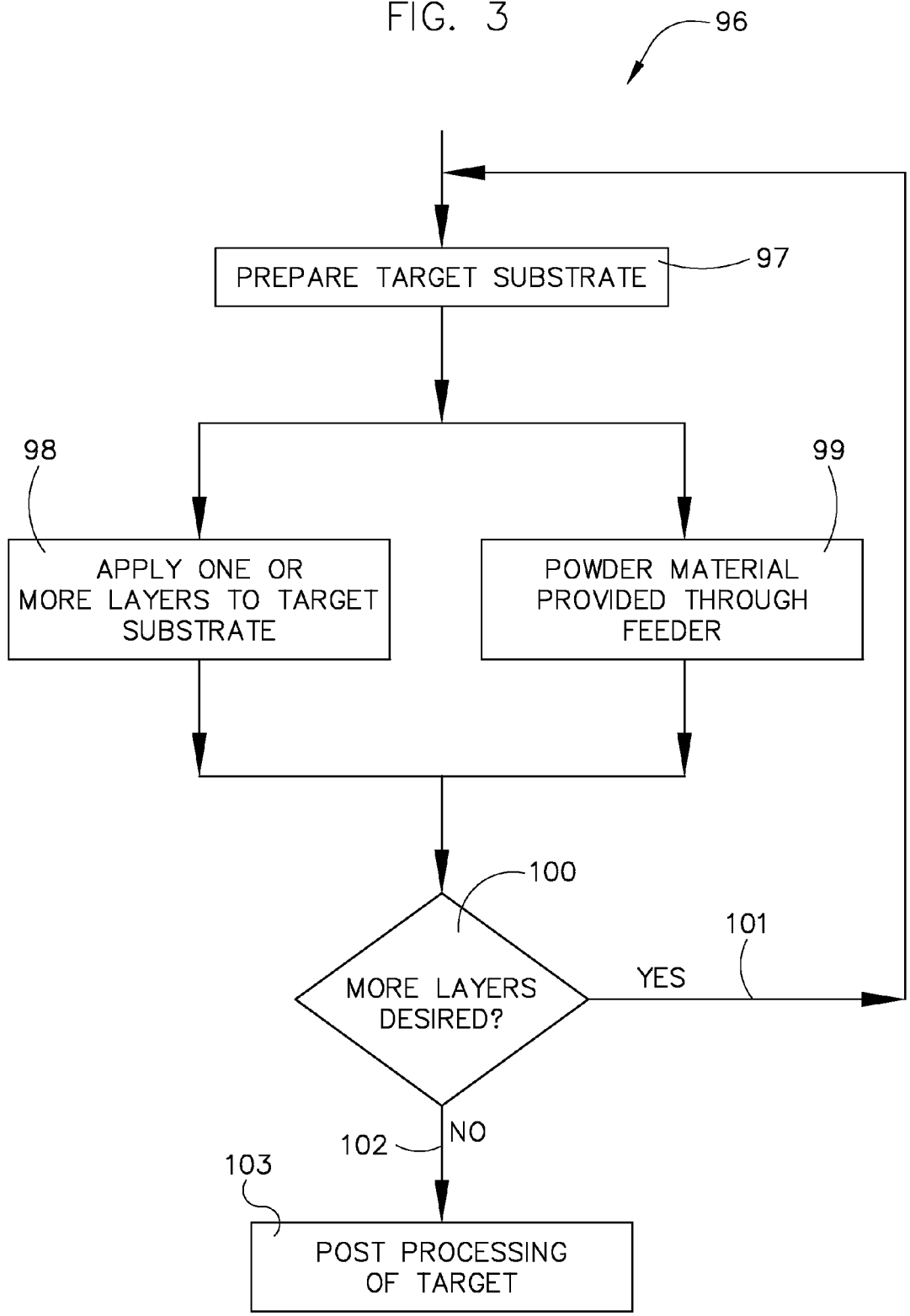
FIG. 3 is a flowchart of a target fabrication or repair process according to an embodiment of the present invention.

According to embodiments of the present invention, the target track 86 may be applied to a base substrate such as target substrate 84 by a laser consolidation process 96 as illustrated in FIG. 3. In process 96, the target substrate 84 is prepared at step 97, which may include, but is not limited to: 1) heat treatment such as may be required for densification, stress relief, and the like; 2) surface preparation which may include cleaning, fusing, roughening, and the like; and 3) cleaning and mounting of the target substrate 84 in a fixture. At step 98, one or more beams of laser energy are arranged to impinge an area of the target substrate 84, thus heating a region of the target substrate 84. In one embodiment of the present invention, the heating of the target substrate 84 is adequate to melt a region of the target substrate 84. At step 99, powdered material is typically simultaneously supplied through a feeder to the heated region of the target substrate 84 at a rate that is controlled so that the added material melts and bonds with the underlying material of the target substrate 84. At step 100, after application of a layer, it is determined whether another layer is desired and, if so, the process at 101 repeats steps 97, 98 and 99, which may include changing the material of the powder to be applied as described above. If no further layers are desired, then at step 102, the process calls for moving to a post-processing step at 103, during which the target may be removed, cleaned, and otherwise prepared for further assembly with anode 56. The target track 86 typically may range from thicknesses ranging from tens of microns in thickness to hundreds of microns in thickness.

Figure 4:
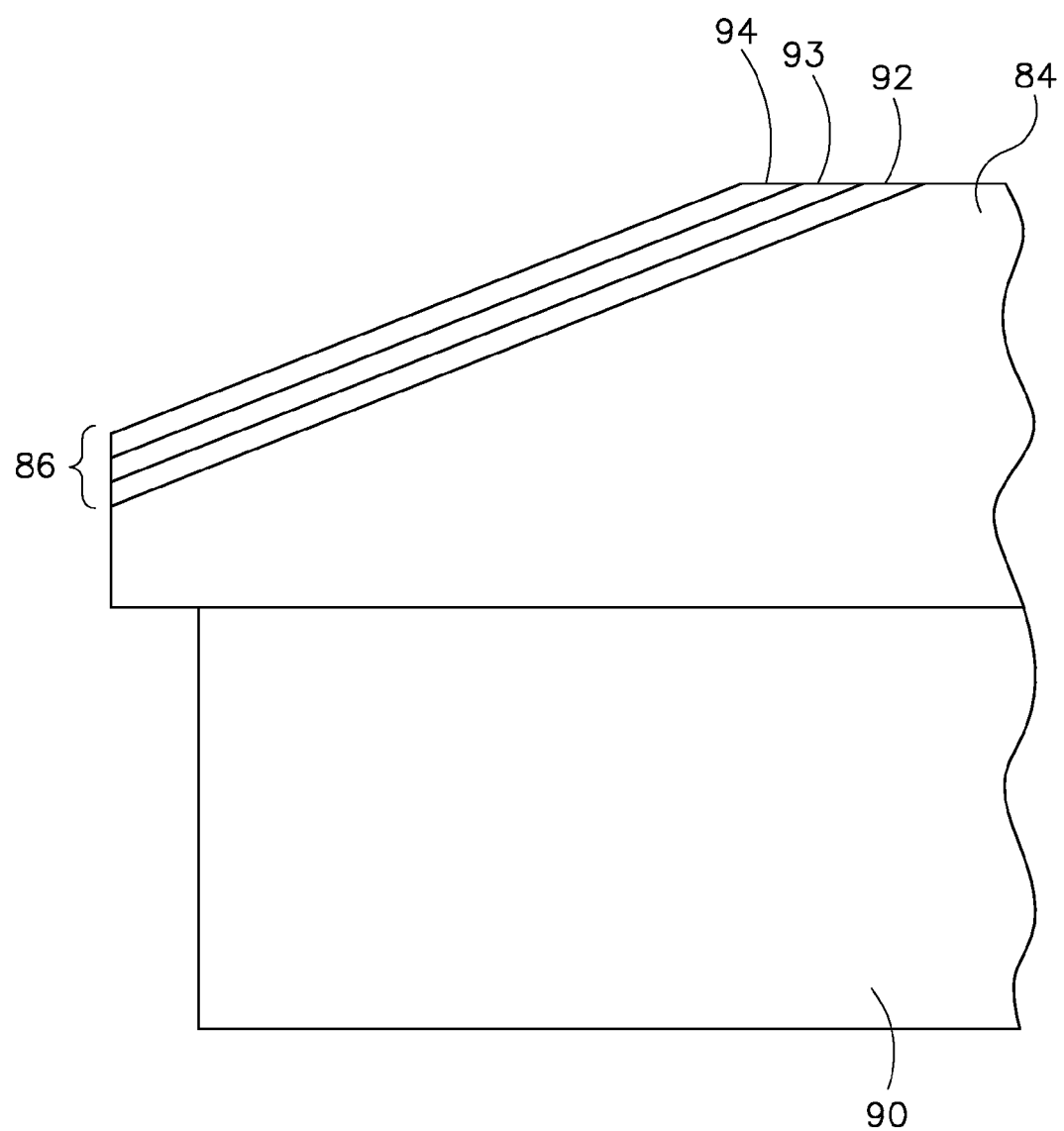
FIG. 4 is a cross-sectional view of an x-ray tube target according to an embodiment of the present invention.

Referring now to FIG. 4, a multi-layer target track 86 may be applied to the target substrate 84 according to an embodiment of the present invention employing process 96 as described in FIG. 3. A first layer 92 is applied to the target substrate 84 as described above. Then, each succeeding layer 93, 94 is applied on preceding layers 92, 93, respectively, one at a time as described above such that layers 92, 93 serve as base substrates for layers 93, 94, respectively. In one embodiment, layer 92 is tungsten, layer 93 is rhenium, and layer 94 is an alloy of tungsten and rhenium. It is recognized that target track 86 may include more or less than three layers, or that the layers 92-94 may include combinations and alloys thereof. It is further recognized that the layers 92-94 may be applied with materials that may include powders that contains a mix of alloying components. As an example, layer 92, for instance, may be applied using a powder having 5% rhenium and in a mixture. As such, layer 92 may be applied as an alloy that will form upon impingement with the heated region on the target substrate 98.

Process 96 may be altered from that described above, according to embodiments of the present invention, to use other materials such as rhodium and its alloys, alloys of tungsten, alloys of molybdenum, alloys of tantalum, alloys of rhenium, and other refractory and non-refractory metals. For instance, one skilled in the art will recognize that specific properties of the target track 86 may be affected according to the thicknesses of individual layers 92-94 applied to the substrate 84, how many layers 92-94 are applied overall, and the selection of materials and their mixtures during process 96 at step 99. Material properties that may be affected by appropriate selection of process 96 parameters include but are not limited to surface emissivity, coefficient of thermal expansion (CTE), thermal conductivity, fatigue strength and crack resistance, and elastic modulus. For instance, one skilled in the art will recognize that tantalum, having a relatively high CTE and a relatively low elastic modulus as compared generally to other metals, may be applied as one or more layers to affect the overall CTE and elastic modulus of target track 86. Furthermore, such materials may not be limited to use as x-ray emission materials, but may also be applied according to an embodiment of this invention as braze materials including, but not limited to, zirconium, titanium, vanadium, and platinum. Such materials may also be used for surface emissivity enhancement. Additionally, one skilled in the art would recognize that layers of materials 92, 94, 96 may be applied to the target substrate 84 to protrude or extend from a surface of the substrate 84.

One skilled in the art will further recognize that many combinations of materials may be applied in powder form at step 99 of process 96. For instance, a gradient of materials may be applied to fabricate target track 86 by applying, for instance, first layer 92 having 75% tungsten and 25% rhenium, and second layer 93 having 90% tungsten and 10% rhenium. As such, target track 86 may be formed having a gradient, or varying concentration of elements, therein, by appropriately selecting and varying the alloying elements from one layer to the next.

Materials applied using the process described herein need not be limited to those described above. One skilled in the art will recognize that, in addition to metals, oxides, including but not limited to oxides of lanthanum, yttrium, aluminum, and zirconium, may be applied according to embodiments of the present invention. Furthermore, carbides, including but not limited to carbides of titanium, hafnium, and boron, may be applied as well.

The process 96 disclosed herein can likewise be performed on pre-formed target cap materials. Accordingly, the materials deposited thereon may include wrought materials as well. Additionally, the process described herein allows the deposition of graded structures of track material, as well as complex geometries.

The process described herein need not be limited to new x-ray target fabrication, but may be applicable to repair and reuse of targets as well. Accordingly, targets may be salvageable by disassembling them from the x-ray tube and reprocessing them by using the method described herein. Targets having track material 86 damaged after use may be recovered by having the target track 86 replaced or repaired. Additionally, new targets fabricated with defects that may include but are not limited to pits, cracks, and voids may be recoverable via this method as well. As such, target preparation step 97 of process 96 may include but is not limited to target disassembly from an anode 56, and machining or grinding of the target track 86 to expose the substrate 84 prior to applying a first layer 92.

High-density coatings may be fabricated with this method as well. Density problems inherent in, for instance, a plasma-spray process may be mitigated by use of this process to apply high-density coatings to increase mechanical properties such as spallation and fatigue resistance. For some materials and material combinations, post-processing including but not limited to hot isostatic pressing (HIP) processing may be required.

Figure 5:
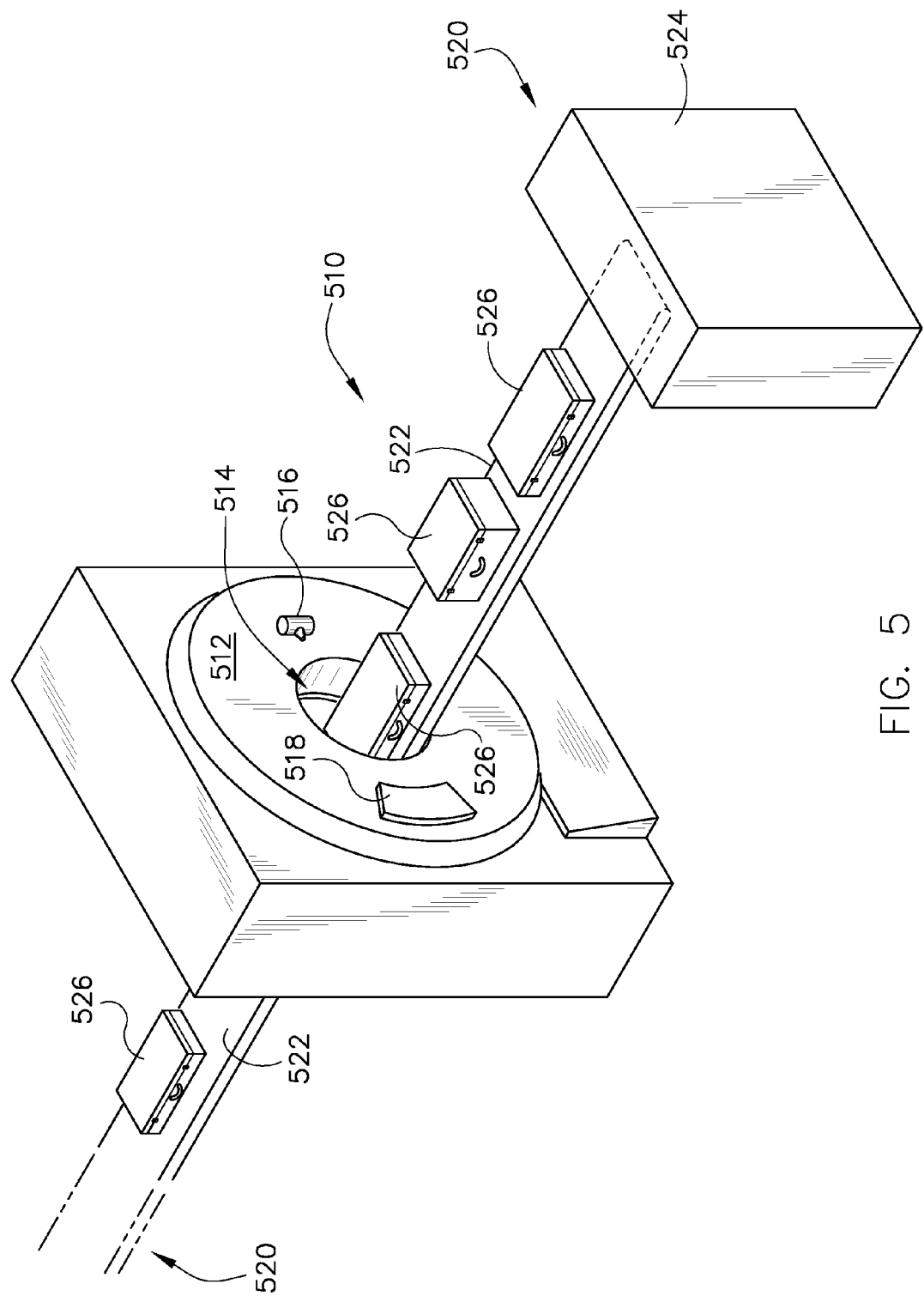
FIG. 5 is a pictorial view of a CT system for use with a non-invasive package inspection system.

Referring now to FIG. 5, package/baggage inspection system 510 includes a rotatable gantry 512 having an opening 514 therein through which packages or pieces of baggage may pass. The rotatable gantry 512 houses an x-ray energy source 516 as well as a detector assembly 518 having scintillator arrays comprised of scintillator cells similar to that shown in FIG. 4 or 5. A conveyor system 520 is also provided and includes a conveyor belt 522 supported by structure 524 to automatically and continuously pass packages or baggage pieces 526 through opening 514 to be scanned. Objects 526 are fed through opening 514 by conveyor belt 522, imaging data is then acquired, and the conveyor belt 522 removes the packages 526 from opening 514 in a controlled and continuous manner. As a result, postal inspectors, baggage handlers, and other security personnel may non-invasively inspect the contents of packages 526 for explosives, knives, guns, contraband, etc.

Figure 6:
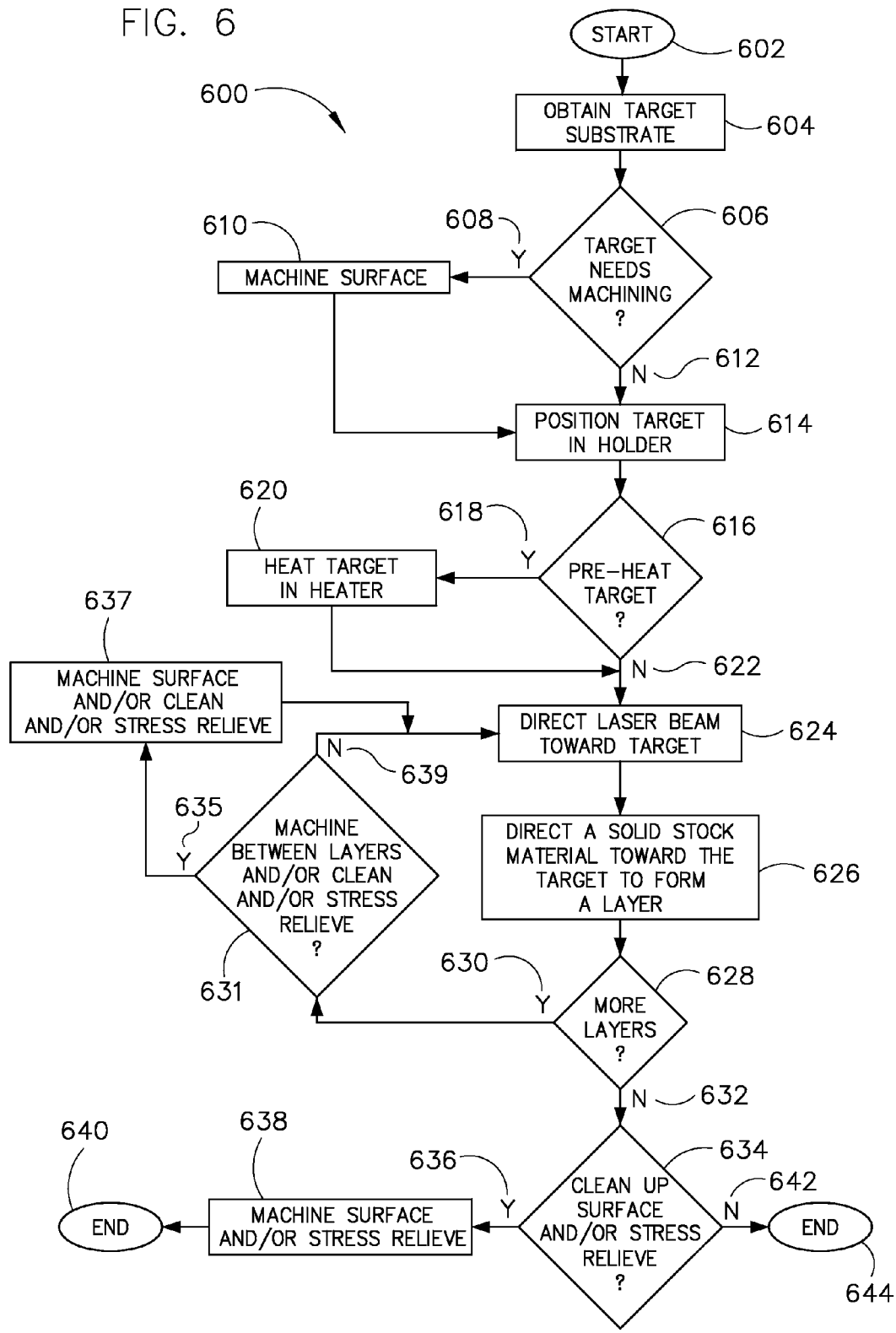
FIG. 6 is a technique for fabrication of a new target and repair of an existing target, according to embodiments of the invention.

Referring now to FIG. 6, a technique 600 is illustrated that includes fabrication of a new target and repair of an existing target, according to embodiments of the invention. Technique 600 begins at step 602, and at step 604, a target is obtained. In one embodiment of the invention, the target obtained may be a new target substrate that is prepared and ready for a target track to be applied thereto, according to embodiments of the invention. In another embodiment, despite being a new target that may already have its track applied thereto, it may be determined that aspects of the target need re-work or repair prior to use, such as when a target has a surface specification (such as a flatness) that is out of specification. Conversely, the target obtained may be a used target in need of having a track repaired or re-worked, according to another embodiment of the invention. In some instances, either for a new target or for a target repair, it may be desirable to machine the target prior to applying a layer or repairing a track. Thus, at step 606, if the target is to be machined 608, then a surface of the target is machined at step 610.

Whether machined at step 610 or not 612, the target is positioned in a holder at step 614. At step 616 it is determined whether to pre-heat the target. If so 618, then at step 620 the target is pre-heated. And, whether pre-heated or not 622, energy may be directed toward the target at step 624. In embodiments of the invention, the energy directed toward the target at step 624 includes a beam of laser energy or a spatially coherent electromagnetic beam. However, the invention is not to be so limited, and is applicable to use of any heating method where a surface may be selectively heated, to include induction heating, electron-beam heating, and focused infrared heating, as examples. Thus, although a laser beam may be described for the purpose of heating a surface, it is to be understood that any heating method, as described, may likewise be used within the scope of the invention.

In embodiments of the invention, the holder is placed in an atmosphere conducive to laser cladding and LENS deposition including an atmosphere that prevents substantial surface reaction of the substrate with constituents present within the atmosphere. High vacuum and inert gases are effective in prohibiting these interactions. Reducing gases such as hydrogen or carbon monoxide are typically effective in preventing oxidation. As understood within the art, depending on substrate composition, the atmosphere should be free of some constituents. For example, the atmosphere should be free of sulfur to avoid the formation of silver sulfide (aka tarnish), or free of nitrogen to avoid the formation of titanium nitride.

In embodiments of the invention, the holder is a moveable holder, and the target may be moved while directing the laser thereto. In other embodiments of the invention, the target is maintained in a stationary position with respect to the laser beam in order that a single spot may be repaired or have material applied thereto. In other embodiments of the invention, both the laser and wirefeed are moveable such that the target may be either stationary or moveable, and the laser/wirefeed may be moveable with respect to the target in order to apply spot repair or a full layer thereto.

For instance, in one example, when the target is positioned in the holder at step 614, the holder is a stationary holder that may be clamped and held in position while the laser beam and solid stock material are applied thereto. In such an example, a limited region or spot of material may be applied to the material, and the target may be manually repositioned in order to apply the material in limited portions of the target. In another example, when the target is positioned in the holder at step 614, the holder is a moveable holder that may be used to cause the target to move while the laser and the solid stock material are applied thereto, as described above. In one embodiment, the moveable holder is a turntable that may be used to direct the laser beam and solid stock material to a fixed radial location with respect to the target such that a circumferentially directed cladded layer of material may be applied to the target.

At step 626, one or more solid stocks of material are directed toward the target, according to embodiments of the invention. In embodiments, the solid stock of material is a thin wire stock (sub-millimeter to a few millimeters in diameter), a narrow strip stock (a few millimeters width or less), a thick wire stock (a few millimeters and greater in diameter), and the like. In one embodiment, the solid stock of material is a wide strip stock that is a few millimeters in width or greater. In embodiments of the invention, the solid stock material is molybdenum or alloys thereof, tungsten or alloys thereof (e.g., with rhenium), and tantalum or alloys thereof. In one example, an alloy of tungsten, rhenium, and tantalum is used. In one embodiment of the invention the solid stock or wirefed material is optionally heated by a heater in situ to a temperature below its melt temperature and prior to entering the beam. Thus, in this embodiment, because the solid stock is pre-heated, there is therefore less heating applied to the target in order to melt the solid stock material. As such, thermally induced distortion of the target may be reduced when applying a spot or material layer thereto.

In directing the solid stock of material toward the target at step 626, a spot or layer of material may be melted and formed on the target, according to embodiments of the invention. In one embodiment, the laser is directed toward a target surface, thereby causing the target to melt. In this embodiment, the solid stock is directed into the melted target material and the solid stock, in turn, melts and mixes with the melted target material. In another embodiment, the laser is directed toward the target, but the solid stock of material is directed into a path of the laser, causing the solid stock of material to melt and form on the target. In still another embodiment, the laser is directed toward the target, and the solid stock of material is simultaneously applied to a location where the laser impinges on the target, causing both the target and the solid stock of material to melt and mix. In yet another embodiment, in an instance where a wide strip stock solid material is used to add material to a target, it is possible to raster the laser beam in a direction that is transverse to a direction of a portion of the target where the laser beam is applied in order to heat and melt a region of the target and the wide stock material that is significantly wider than the laser beam. Further, instead of rastering the laser beam, embodiments of the invention also include moving the target with respect to the beam, in which case a stationary beam may be rastered by instead moving the target. In examples, an articulated robot or robotic arm may be used to move the beam with respect to the target, or the target with respect to the beam. In an alternate embodiment, instead of rastering the beam to heat and/or melt a wide strip solid stock material, a line shape diode source may be instead used to heat the wide strip. In other words, a plurality of heating sources, such as to form a line shape diode source, may be used to cause heating and melting of the wide strip solid stock material.

Thus, embodiments of the invention include multiple techniques for applying a solid stock of material to a target surface via a laser, and one skilled in the art will recognize that techniques may be developed for applying the combination of a laser beam or other heating method, and a solid stock of material, in order to apply a material or layer to a target. Such techniques are included within the scope of this invention.

At step 628, it is determined whether an additional layer or spot of material is desired to be applied to the target. If so 630, then technique 600 next determines at step 631 whether to machine, grind, clean, stress relieve, and/or otherwise work the surface of the additional layer or spot. If so 635, then the surface of the target is machined and/or cleaned and/or stress relieved at step 637 and control returns to step 624 such that material may again be applied. If not 639, then control returns to step 624 with no machining, cleaning, or stress relieving between layers. When control returns to step 624, a laser beam is again directed toward the target. In this example, the target may be re-positioned in the holder in order that the laser beam may be directed toward another spot on the target, or toward a different circumferential location of the target. If no additional layer or spot of material is desired to be applied to the target 632, then it is next determined at step 634 whether to clean up the surface of the target and/or stress relieve the target prior to use. If so 636, then surfaces of the target may be machined and/or stress relieved at step 638, and technique 600 ends at step 640. If no surface cleanup is desired or necessary 642, then technique 600 ends at step 644.

Thus, in embodiments of the invention, a balance mark, an out-of-tolerance region, a focal track erosion region, and a focal track crack region may be repaired. Embodiments of the invention also include enabling grading a target substrate and layering chemistries of the same or differing materials thereon. Further, embodiments of the invention include enabling the use of wrought materials for substrates. Thus, laser cladding and LENS deposition enable the incorporation of solid substrate preforms, meaning that it enables an alternative to typical co-pressing (and ensuing co-processing requirements) of substrate powder and layer powder. By depositing layers onto a solid substrate, additional material choices are enabled, including both material compositions and degrees of material processing. Wrought (i.e., mechanically worked) material offers key advantages in unique instances, such as with ODS-Mo (oxide dispersion strengthened molybdenum alloy) wherein mechanical working results in a refined dispersion strengthened microstructure that possesses great advantages in re-crystallization temperature and creep resistance (among others).

Figure 7:
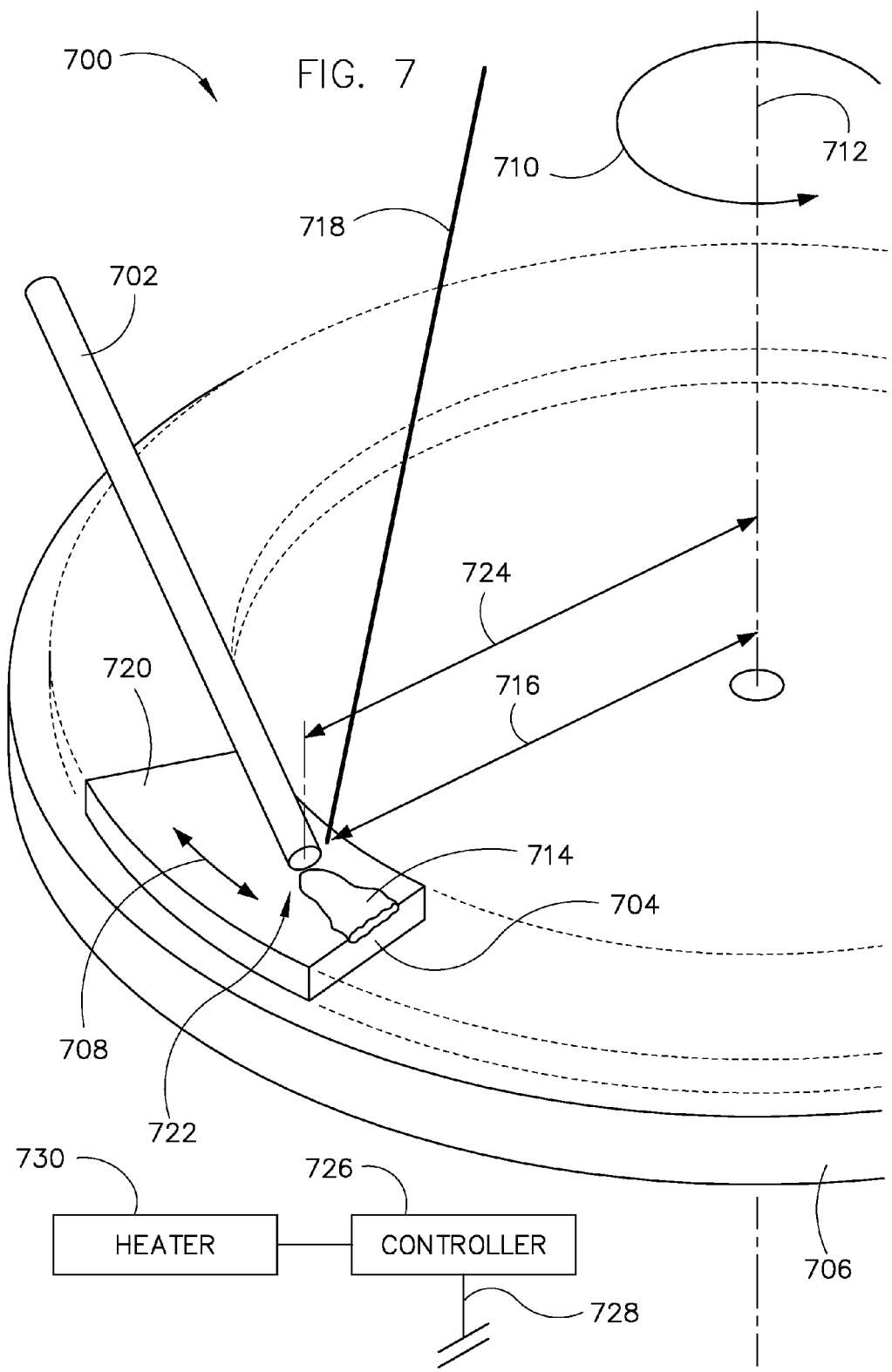
FIG. 7 a system for applying a solid stock material to an x-ray tube target according to embodiments of the invention.

FIG. 7 illustrates a system or apparatus 700 for applying a solid stock material 702 to an x-ray tube target 704, according to embodiments of the invention. As illustrated, system 700 includes a holder 706 on which target 704 is positioned. Holder 706 may be configured to linearly translate 708 target 704, or holder 706 may be configured to rotate 710 target 704 about a rotational center 712 such that a cladded layer 714 may be deposited and formed thereon at a radial distance 716 from rotational center 712. System 700 includes an ability to apply a laser beam or a spatially coherent electromagnetic beam 718 to a surface 720 of target 704, according to embodiments of the invention. Further, it is to be understood that the invention is not limited to application of a laser beam or a spatially coherent electromagnetic beam, and that surface 720 of target 704 may likewise be heated using any heating method, and that beam 718 may represent induction heating, an electron-beam, and a focused infrared beam, as examples.

As stated with respect to technique 600 above, embodiments of the invention include directing a laser toward the target surface 720, in which case the solid stock material 702 is directed into melted target material and the solid stock material 702, in turn, melts and mixes with the melted target material. Embodiments also include directing laser beam 718 toward target 704 but solid stock of material 702 is directed into a path of the laser beam 718, causing solid stock of material 702 to melt and form on target 704. Another embodiment includes directing laser beam 718 toward target 704 and solid stock of material 702 is simultaneously applied to a location 722 where laser beam 718 impinges on target 704, causing both target 704 and solid stock of material 702 to melt and mix. In the embodiment where a wide strip stock solid material 702 is used to add material to target 704, it is possible to raster or rapidly alternate laser beam 718 back and forth in a direction 724 that is transverse to direction 708, in order to heat and melt a region of target 704 and stock material 702 that is significantly wider than laser beam 718.

System 700 includes a controller 726 having one or more control lines 728, and controller 726 is configured to control operational aspects of system 700. In embodiments of the invention that include pre-heating the target, system 700 includes a heater 730 that may be used to heat or pre-heat target 704. Further, one skilled in the art will recognize that heater 730 need not be part of system 700 that is controlled by controller 726, but that heater 730 may be a device that is entirely separate of system 700 and separately controlled. One skilled in the art will also recognize that the heater may be used to heat only x-ray tube target 704, or it may be used to heat x-ray tube target 704 after it has been placed in holder 706.

Thus, according to the invention and as understood in the art, controller 726 is configured to control either a linear translation rate, distance traveled, timing, etc. of holder 706 along linear path 708 (in an embodiment that includes linear travel), and controller 726 is configured to rotate holder 706 about rotational axis 710 at a desired rotational rate (in an embodiment that includes rotational travel), as examples. Controller 726 is also able to control other aspects of system 700 such as a feed rate of material 702, power and location of laser beam 718, heater 730, and the like. Thus, embodiments of the invention include system 700 having a controller 726 for controlling application of a solid stock of material to a target surface via a laser.

A technical contribution for the disclosed method and apparatus is that it provides for a system for applying a target track material and a method of fabrication.

According to one embodiment of the invention, a system for applying a target track material to an x-ray tube target includes a controller configured to direct a beam of energy toward an x-ray tube target, and direct a solid stock material toward the beam of energy to cause the solid stock material to melt and deposit as a melted material on the x-ray tube target.

According to another embodiment of the invention, a method of fabricating an x-ray tube target includes directing a spatially coherent electromagnetic beam toward a region of a target substrate, and feeding a metallic stock material toward the region of the target substrate to melt the metallic stock material and form a first layer on the target substrate.

According to yet another embodiment of the invention, a method of repairing an x-ray tube target includes pointing a laser beam toward a region of an x-ray tube target to be repaired, such that the region is caused to melt and form a melt region, and regulating a solid feedstock toward the melt region.

Embodiments of the invention have been described in terms of the preferred embodiment, and it is recognized that equivalents, alternatives, and modifications, aside from those expressly stated, are possible and within the scope of the appending claims.

What is claimed is:

1. A system for applying a target track material to an x-ray tube target, the system comprising a controller configured to:
   direct a beam of energy onto an x-ray tube target; and
   direct a solid stock material toward the beam of energy to cause the solid stock material to melt and deposit as a layer of melted material on the x-ray tube target, wherein the solid stock material has a width that is greater than a width of the beam of energy.

2. The system of claim 1 wherein the beam of energy is one of a laser beam, an electron-beam, a focused infrared beam, and energy from an induction heater.

3. The system of claim 1 wherein the controller is configured to move a portion of the x-ray tube target in a first direction relative to the beam of energy while directing the beam of energy toward the x-ray tube target and while directing the solid stock material toward the beam of energy.

4. The system of claim 3 wherein the controller is configured to raster the beam of energy in a second direction that is transverse to the first direction.

5. The system of claim 1 wherein the controller is configured to direct the beam of energy into the x-ray tube target to form an x-ray tube target melt pool, and direct the solid stock material into the x-ray tube target melt pool to cause the solid stock material to melt.

6. The system of claim 1 wherein the controller is configured to simultaneously direct the beam into the x-ray tube target and direct the solid stock material into the beam to cause the solid stock material to melt.

7. The system of claim 1 wherein the controller is configured to direct power to a heater to pre-heat the target prior to directing the beam of energy toward the target.

8. The system of claim 1 wherein the controller, in being configured to direct a solid stock material, is configured to direct one of a wire, a strip, and a rod toward the locally melted location.

9. A method of fabricating an x-ray tube target, the method comprising:
   directing a spatially coherent electromagnetic beam onto a region of a target substrate; and
   feeding a solid stock material toward the region of the target substrate to melt the solid stock material and form a first layer of material from the solid stock material on the target substrate, wherein the solid stock material has a width that is greater than the spatially coherent electromagnetic beam.

10. The method of claim 9 further comprising pre-heating the target substrate prior to directing the spatially coherent electromagnetic beam toward the region of the target substrate.

11. The method of claim 9 further comprising moving a portion of the target substrate in a first linear direction with respect to the spatially coherent electromagnetic beam.

12. The method of claim 9 wherein feeding the solid stock material comprises feeding one of molybdenum, an alloy of molybdenum, tungsten, an alloy of tungsten, tantalum, and an alloy of tantalum.

13. A method of repairing an x-ray tube target, the method comprising:
    applying a laser beam to a region of an x-ray tube target to be repaired, such that the region is caused to melt and form a melt region; and
    regulating a solid feedstock toward the melt region to cause the solid feedstock to melt in the melt region and deposit molten solid feedstock material on the x-ray tube target, wherein regulating the solid feedstock toward the melt region comprises regulating the solid feedstock having a width that is greater than that of the laser beam.

14. The method of claim 13 further comprising identifying a region of the x-ray tube target to repair prior to pointing the laser beam toward the region, the region comprising one of a balance mark, an out-of-tolerance region, a focal track erosion region, and a focal track crack region.

15. The method of claim 13 further comprising heating the target substrate prior to pointing the laser beam toward the region of the x-ray tube target to be repaired.

16. The method of claim 13 further comprising displacing the x-ray tube target in a linear direction while pointing the laser beam toward the region of the x-ray tube target to be repaired.

17. The method of claim 13 wherein the solid feedstock is one of a wire, a strip, and a rod.

18. The system of claim 1 wherein the controller is configured to heat the solid stock material to a temperature below its melt temperature prior to directing the solid stock material toward the beam of energy.

19. The method of claim 9 comprising heating the solid stock material to a temperature below its melt temperature prior to feeding the solid stock material toward the region of the target substrate.

20. The method of claim 13 comprising heating the solid feedstock prior to regulating the solid feedstock toward the melt region.

* * * * *